(12) United States Patent
Okabe et al.

(10) Patent No.: US 12,310,194 B2
(45) Date of Patent: May 20, 2025

(54) DISPLAY DEVICE WITH INTERLAYER INSULATING FILM HAVING COLUMN SLIT FOR POWER-SOURCE LINE

(71) Applicant: SHARP KABUSHIKI KAISHA, Osaka (JP)

(72) Inventors: Tohru Okabe, Sakai (JP); Takao Saitoh, Sakai (JP); Yohsuke Kanzaki, Sakai (JP); Shinji Ichikawa, Sakai (JP); Ryosuke Gunji, Sakai (JP); Shinsuke Saida, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 542 days.

(21) Appl. No.: 17/787,624

(22) PCT Filed: Dec. 27, 2019

(86) PCT No.: PCT/JP2019/051448
§ 371 (c)(1),
(2) Date: Jun. 21, 2022

(87) PCT Pub. No.: WO2021/131022
PCT Pub. Date: Jul. 1, 2021

(65) Prior Publication Data
US 2022/0415999 A1 Dec. 29, 2022

(51) Int. Cl.
*H10K 59/131* (2023.01)
*H10K 59/35* (2023.01)

(52) U.S. Cl.
CPC ......... *H10K 59/131* (2023.02); *H10K 59/353* (2023.02)

(58) Field of Classification Search
CPC .......................... H10K 59/131; H10K 59/353
See application file for complete search history.

(56) References Cited

U.S. PATENT DOCUMENTS

| | | | |
|---|---|---|---|
| 2009/0153044 A1* | 6/2009 | Yanagihara | H10K 59/131 313/504 |
| 2014/0353670 A1* | 12/2014 | Youn | H10D 86/60 438/586 |
| 2016/0155828 A1* | 6/2016 | Sugawara | H01L 21/0234 438/104 |
| 2017/0012094 A1 | 1/2017 | Lee | |
| 2017/0062761 A1 | 3/2017 | Kuriyagawa et al. | |
| 2019/0131589 A1* | 5/2019 | Matsueda | H10K 59/131 |

FOREIGN PATENT DOCUMENTS

| | | |
|---|---|---|
| JP | 2017044921 A | 3/2017 |
| JP | 2018125303 A | 8/2018 |

* cited by examiner

*Primary Examiner* — Lex H Malsawma
(74) *Attorney, Agent, or Firm* — ScienBiziP, P.C.

(57) ABSTRACT

A first connection wire electrically connected to a first electrode via a first through-hole formed in a second flattening film, and a second connection wire electrically connected to the first connection wire via a second through-hole formed in a first flattening film are provided, and a second interlayer insulating film has a contact opening so as to pass through the second interlayer insulating film to overlap the first connection wire, and such that the edge of the contact opening surrounds the first through-hole and the second through-hole in a plan view.

10 Claims, 14 Drawing Sheets

DISPLAY DEVICE WITH INTERLAYER INSULATING FILM HAVING COLUMN SLIT FOR POWER-SOURCE LINE

TECHNICAL FIELD

The disclosure relates to a display device.

BACKGROUND ART

In recent years, self-luminous organic EL displays using organic electroluminescence (hereinafter referred also to as EL) elements have received attention as display devices in place of liquid-crystal displays. These organic EL displays include, for instance, abase substrate, a thin-film transistor (hereinafter referred also to as TFT) layer provided on the base substrate, an organic EL element layer provided on the TFT layer, and a sealing film provided so as to cover the organic EL element layer. The TFT layer here includes, for instance, a plurality of TFTs provided on the base substrate, and a flattening film provided so as to cover the individual TFTs. Further, the organic EL element layer includes, for instance, a plurality of first electrodes provided on the flattening film and electrically connected to the respective TFTs of the TFT layer, organic EL layers provided on the respective first electrodes, and a second electrode provided so as to cover the individual organic EL layers.

For instance, Patent Literature 1 discloses a display device including a resin layer provided as a base substrate, a TFT layer provided on the resin layer, and a self-luminous element layer provided on the TFT layer as an organic EL element layer.

CITATION LIST

Patent Literature

Patent Literature 1: Japanese Unexamined Patent Application Publication No. 2017-44921

SUMMARY

Technical Problem

By the way, a structure has been proposed in which the flattening film of the TFT layer is composed of a first flattening film, which is a lower layer, and a second flattening film, which is an upper layer, in which a connection wire is provided between the first flattening film and the second flattening film, and in which the TFT and the first electrode are electrically connected together via the connection wire. In this case, patterning a metal film, formed on the first flattening film, through dry etching in order to form the connection wire onto the first flattening film possibly pollutes the chamber inside of a dry-etching apparatus, because the surface of the first flattening film also undergoes etching. Accordingly, a structure has been proposed in which an interlayer insulating film consisting of an inorganic insulating film is provided on the first flattening film, and in which a connection wire is provided on the interlayer insulating film, thereby preventing the surface of the first flattening film from exposure. Here, the first flattening film has a though-hole provided so as to reach a non-connection wire of the TFT. Further, the interlayer insulating film has a contact hole so that the non-connection wire exposed from the through-hole is exposed. However, when the contact hole is disposed outside the through-hole in a plan view, the through-hole undergoes side etching by dry etching for forming the contact hole, thereby forming the through-hole having an inverted tapered, inclined side surface. Accordingly, the connection wire breaks easily due to a level difference within the through-hole, thereby causing faulty electrical continuity in the connection wire. Further, when the contact hole is disposed inside the through-hole in a in a plan view, the first flattening film, which is made or resin, is relatively thick, thereby failing to form a resist pattern, which is used in forming the contact hole, into a predetermined shape. Accordingly, the contact hole possibly fails to reach the non-connection wire, thus causing faulty electrical continuity in the connection wire.

The disclosure has been made in view of this point, and its object is to prevent faulty electrical continuity between a non-connection wire and a connection wire in a stacked structure in which the non-connection wire, a flattening film, an interlayer insulating film, and the connection wire are provided sequentially.

Solution to Problem

To achieve the above object, a display device according to the disclosure is a display device including the following: a base substrate; a thin-film transistor layer having a semiconductor layer, a first wire layer, and a gate insulating film disposed between the semiconductor layer and the first wire layer, the thin-film transistor layer being provided on the base substrate and including the first wire layer, a first interlayer insulating film, a second wire layer, a first flattening film, a second interlayer insulating film, a third wire layer, and a second flattening film stacked sequentially; a light-emitting element layer provided on the thin-film transistor layer and including a plurality of first electrodes, a plurality of light-emitting layers, and a common second electrode stacked sequentially in correspondence with a plurality of sub-pixels disposed in rows and columns to constitute a display region; a plurality of gate lines provided in the display region as the first wire layer so as to extend in parallel with each other in a row direction; a plurality of source lines provided in the display region as the second wire layer so as to extend in parallel with each other in a column direction; a first connection wire provided in the display region as the third wire layer and electrically connected to the first electrode of each of the plurality of sub-pixels via a first through-hole formed in the second flattening film; and a second connection wire provided in the display region as the second wire layer and electrically connected to the first connection wire via a second through-hole formed in the first flattening film in each of the plurality of sub-pixels, wherein the second interlayer insulating film has a contact opening provided so as to pass through the second interlayer insulating film to overlap the first connection wire, and such that an edge of the contact opening surrounds the first through-hole and the second through-hole in a plan view.

Advantageous Effect of Disclosure

In the disclosure, the second interlayer insulating film has a contact opening provided so as to overlap the first connection wire, and such that its edge surrounds the first through-hole and the second through-hole in a plan view, and hence, faulty electrical continuity between a non-connection wire and a connection wire can be prevented in a stacked structure where the non-connection wire, a flattening film, an interlayer insulating film, and the connection wire are provided sequentially.

DESCRIPTION OF EMBODIMENTS

Embodiments of the disclosure will be detailed on the basis of the drawings. It is noted that the disclosure is not limited to the following individual embodiments.

First Embodiment

Figure 1:
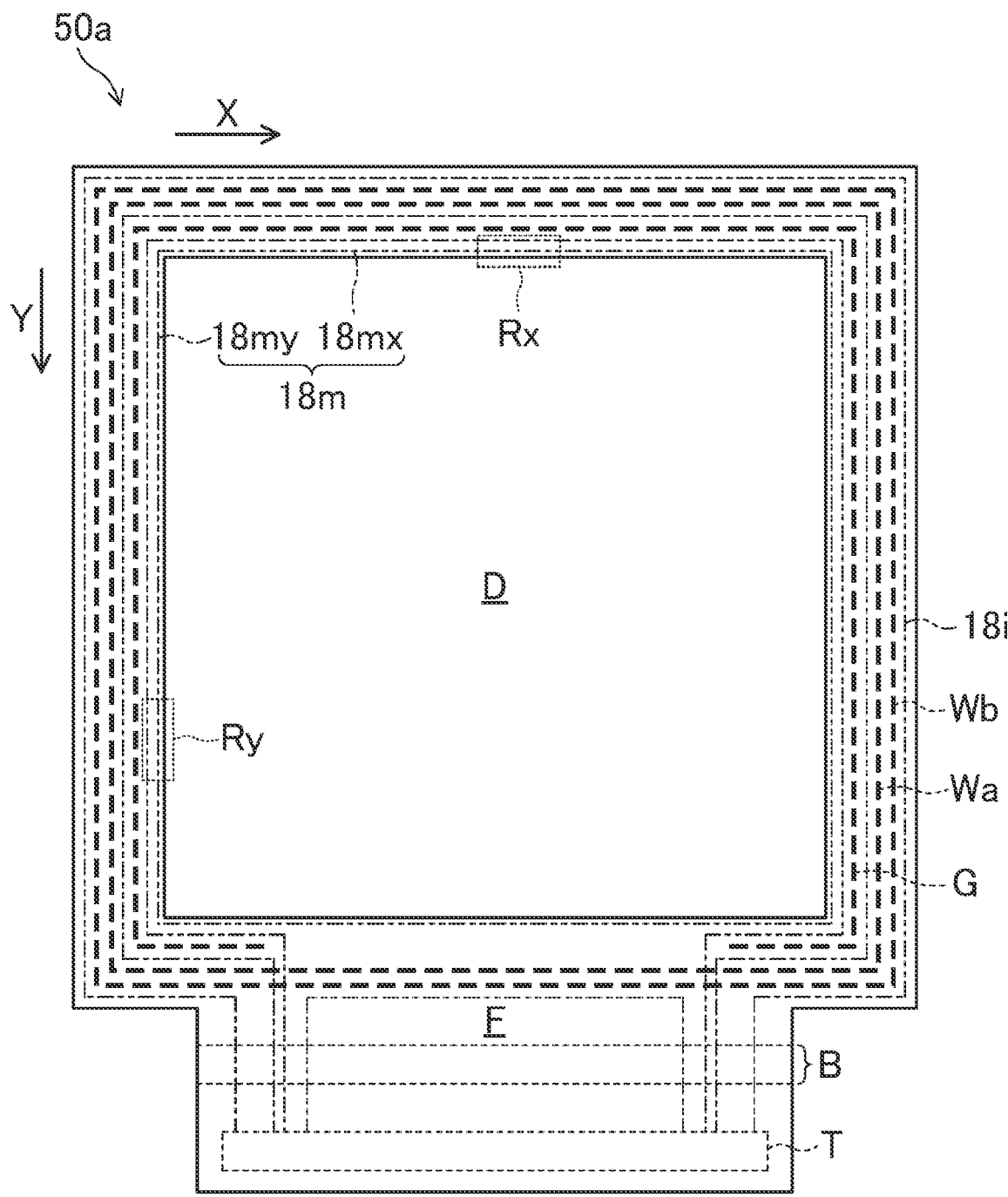
FIG. 1 is a plan view of the schematic configuration of an organic EL display according to a first embodiment of the disclosure.
Figure 2:
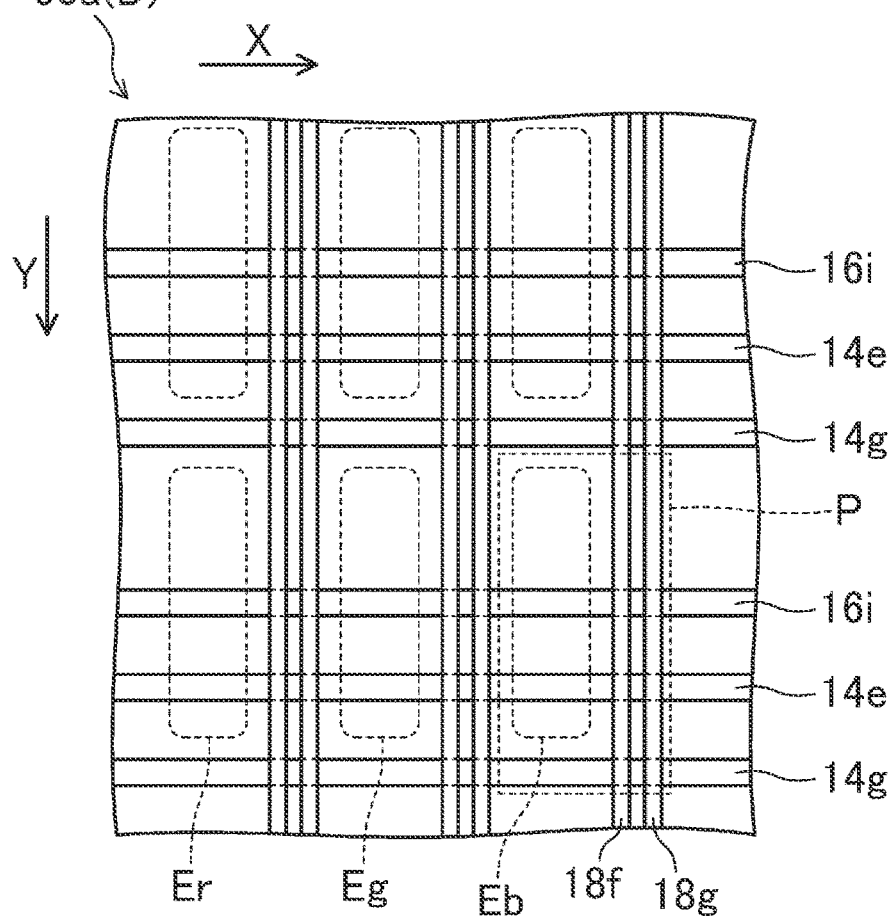
FIG. 2 is a plan view of the display region of the organic EL display according to the first embodiment of the disclosure.
Figure 5:
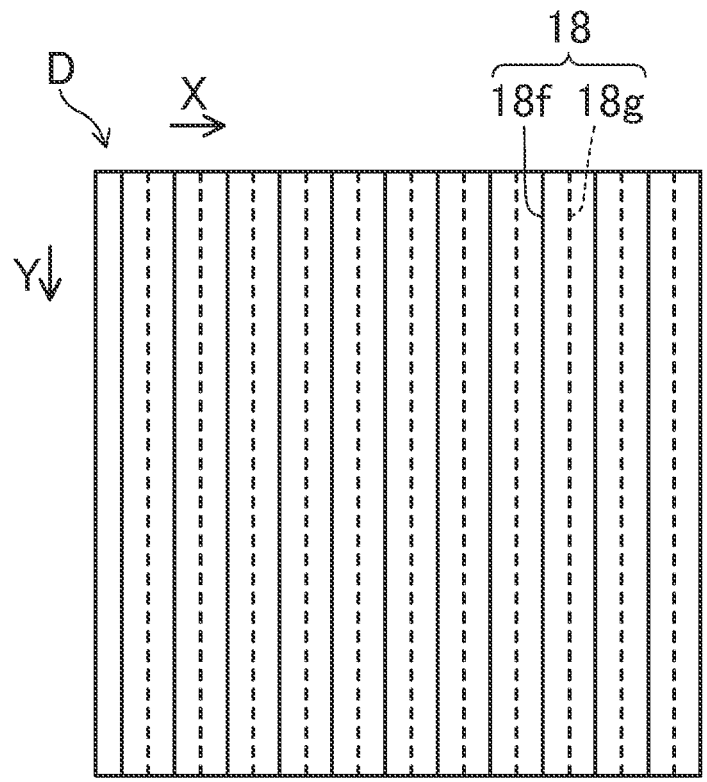
FIG. 5 is a plan view of a second wire layer that is disposed in the display region of the organic EL display according to the first embodiment of the disclosure.
Figure 6:
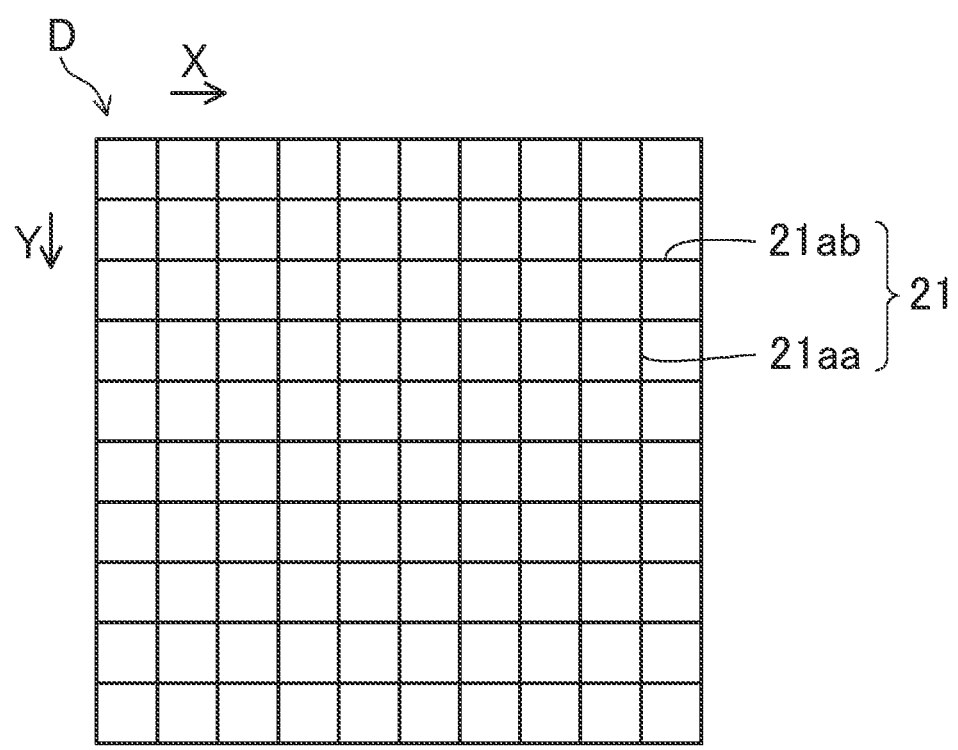
FIG. 6 is a plan view of a third wire layer that is disposed in the display region of the organic EL display according to the first embodiment of the disclosure.
Figure 7:
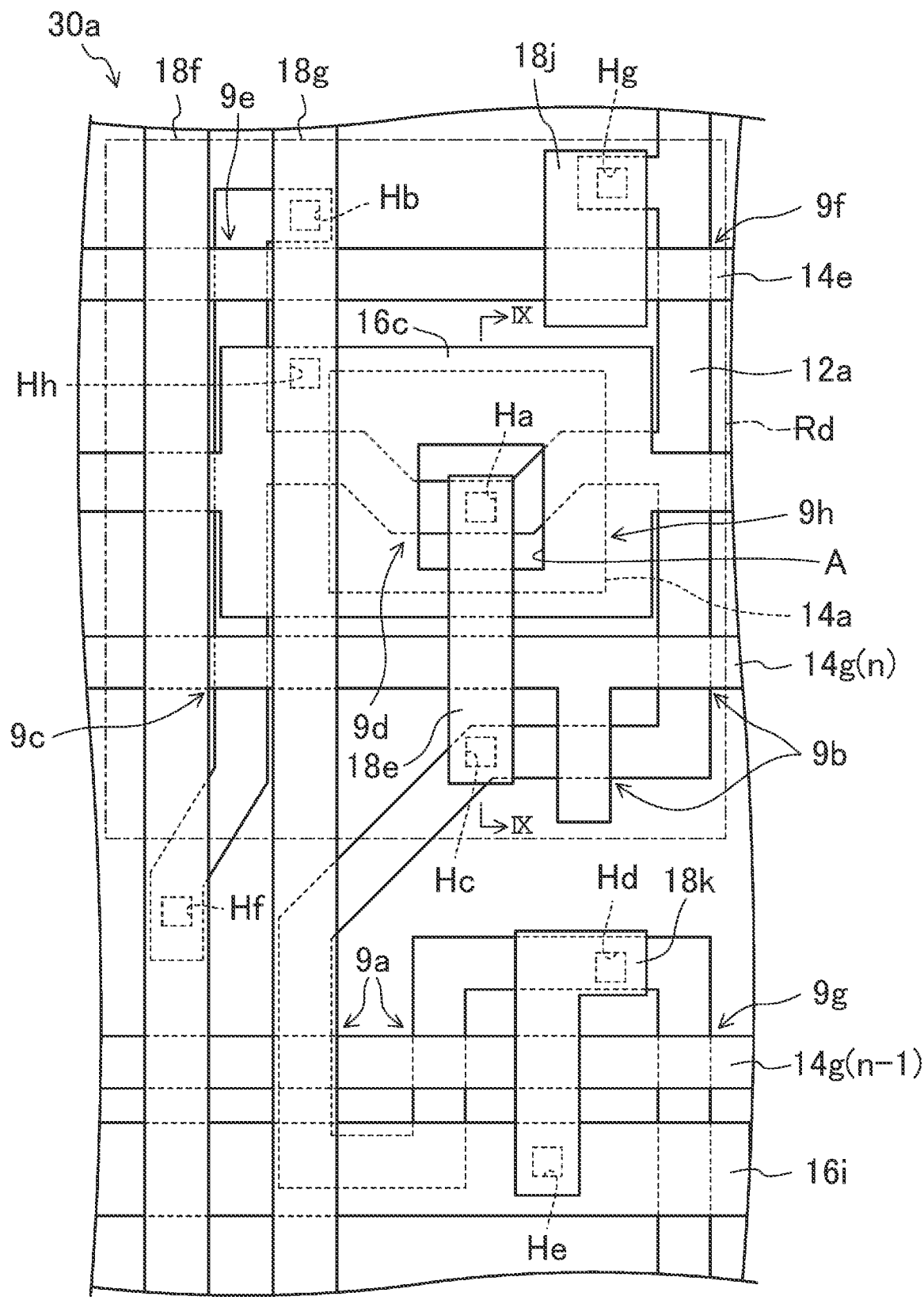
FIG. 7 is a plan view of a TFT layer that constitutes the organic EL display according to the first embodiment of the disclosure.
Figure 8:
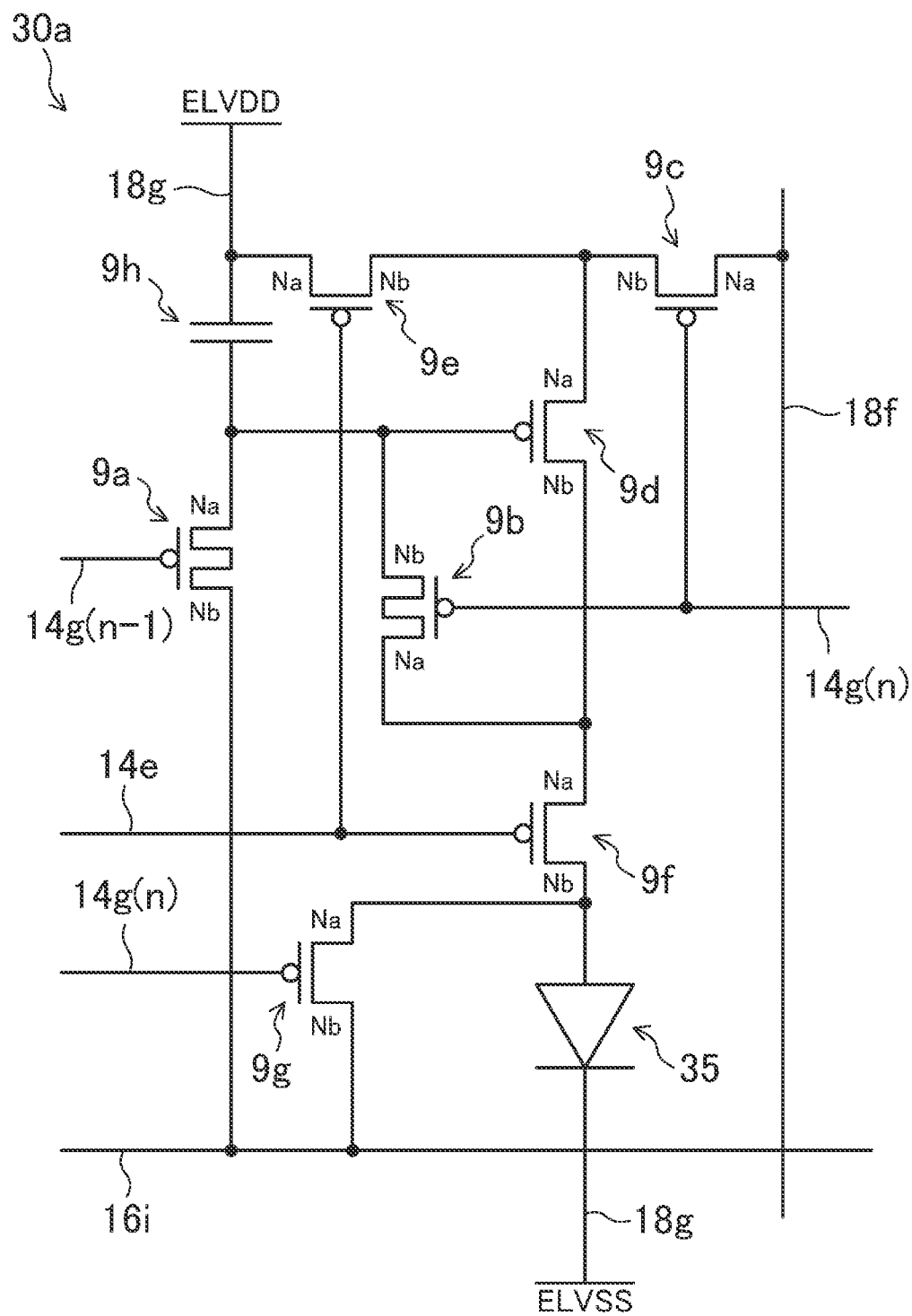
FIG. 8 is an equivalent circuit diagram of the TFT layer, which constitutes the organic EL display according to the first embodiment of the disclosure.
Figure 9:
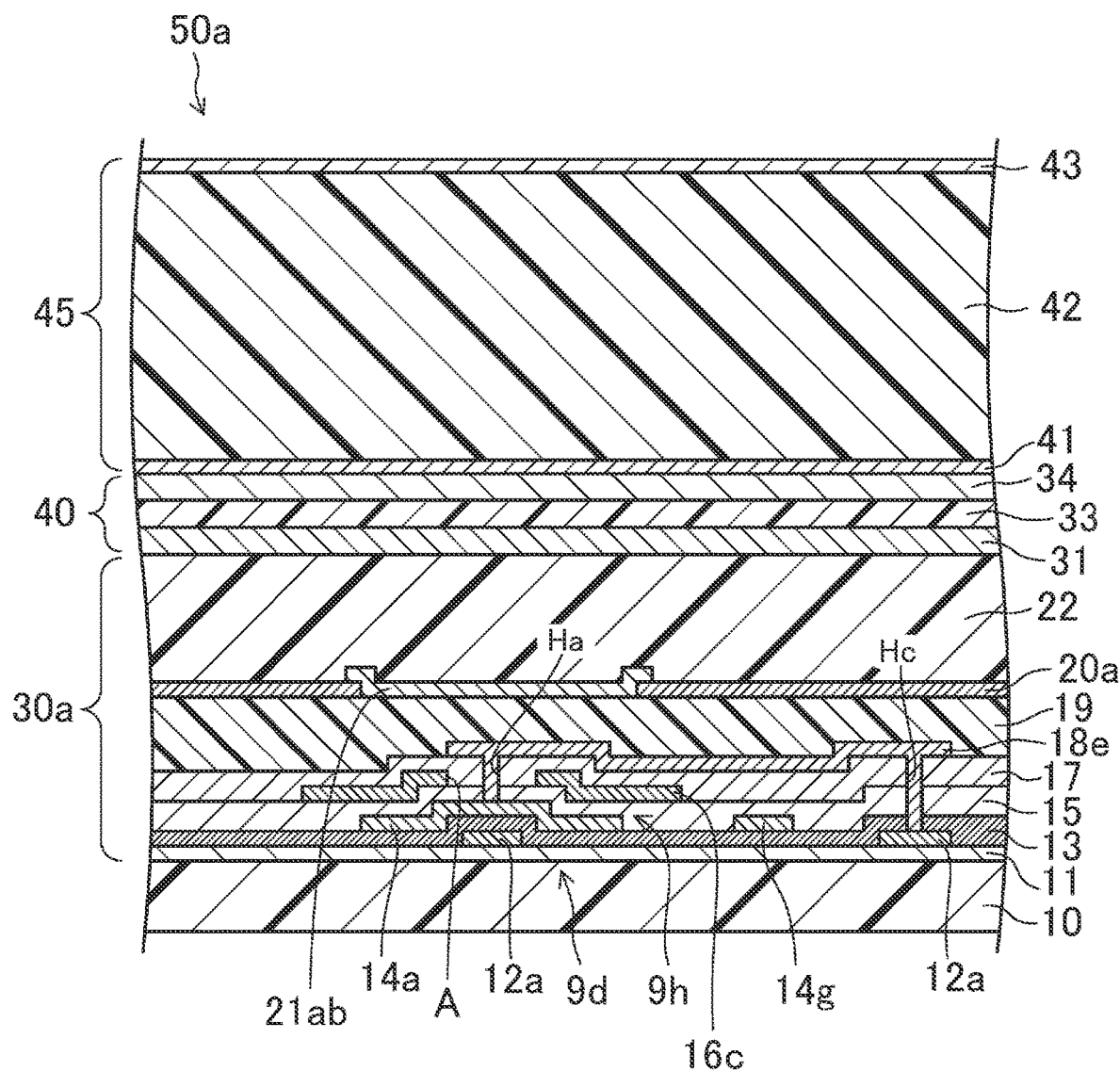
FIG. 9 is a sectional view of the organic EL display taken along line IX-IX in FIG. 7.
Figure 10:
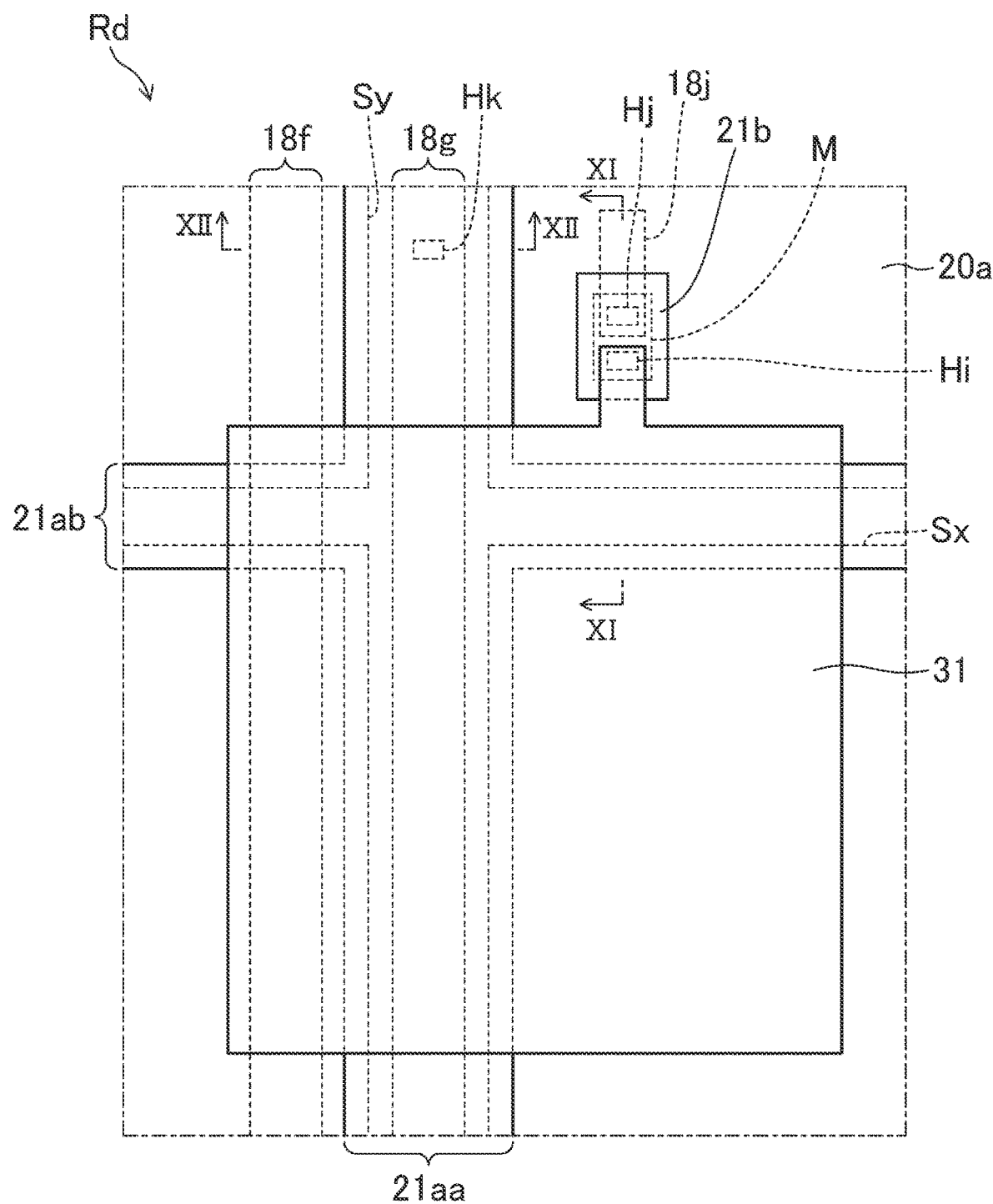
FIG. 10 is an enlarged plan view of a region Rd in FIG. 7 and illustrates, as well, a first electrode of an organic EL element layer that constitutes the organic EL display.
Figure 11:
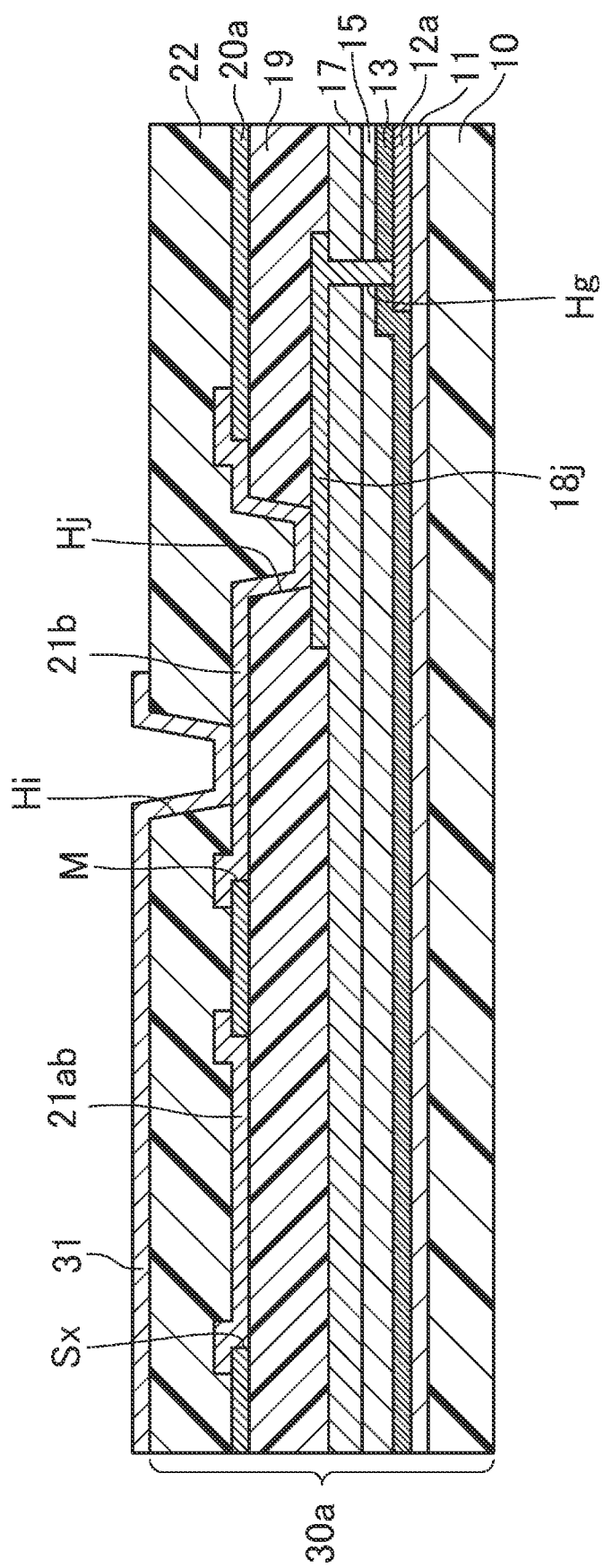
FIG. 11 is a sectional view of the TFT layer taken along line XI-XI in FIG. 10.
Figure 12:
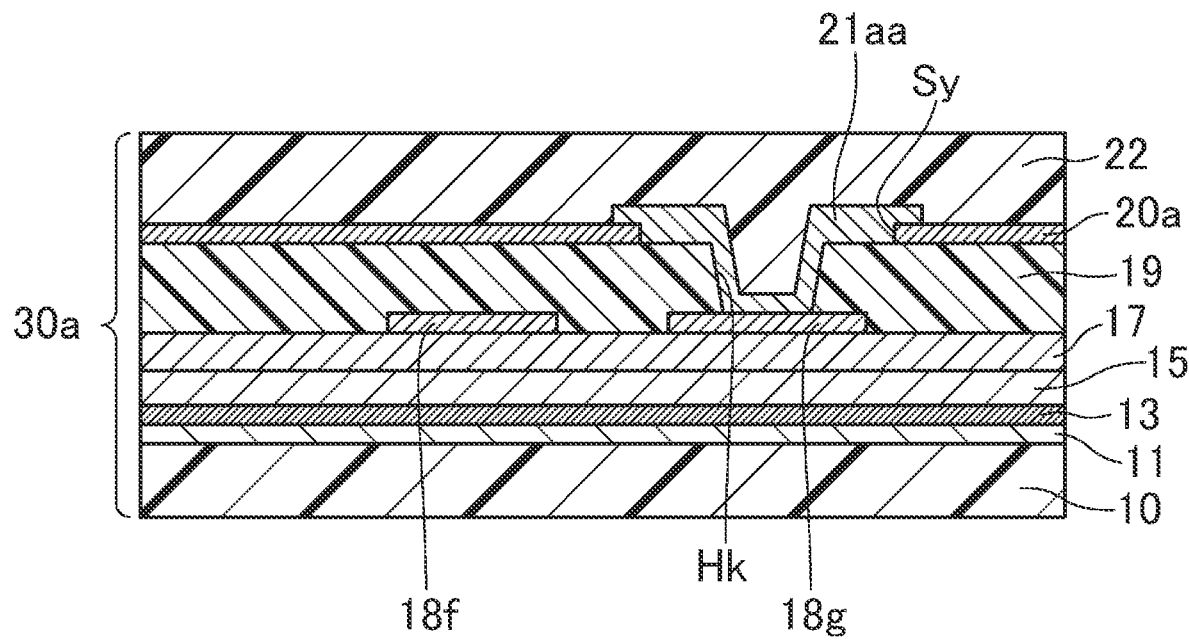
FIG. 12 is a sectional view of the TFT layer taken along line XII-XII in FIG. 10.
Figure 13:
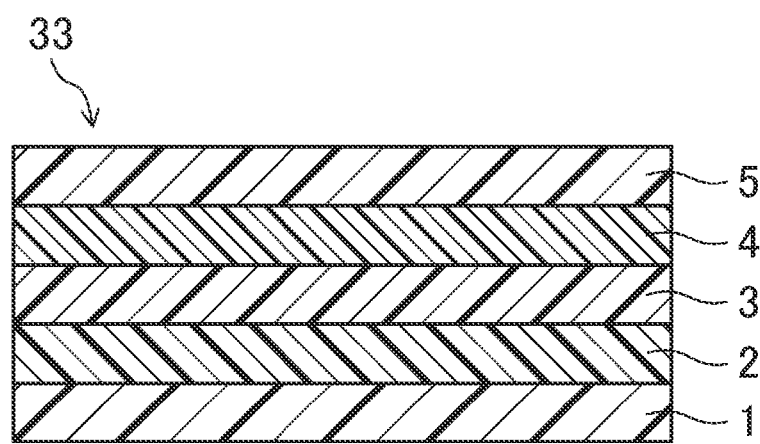
FIG. 13 is a sectional view of an organic EL layer that constitutes the organic EL display according to the first embodiment of the disclosure.
Figure 14:
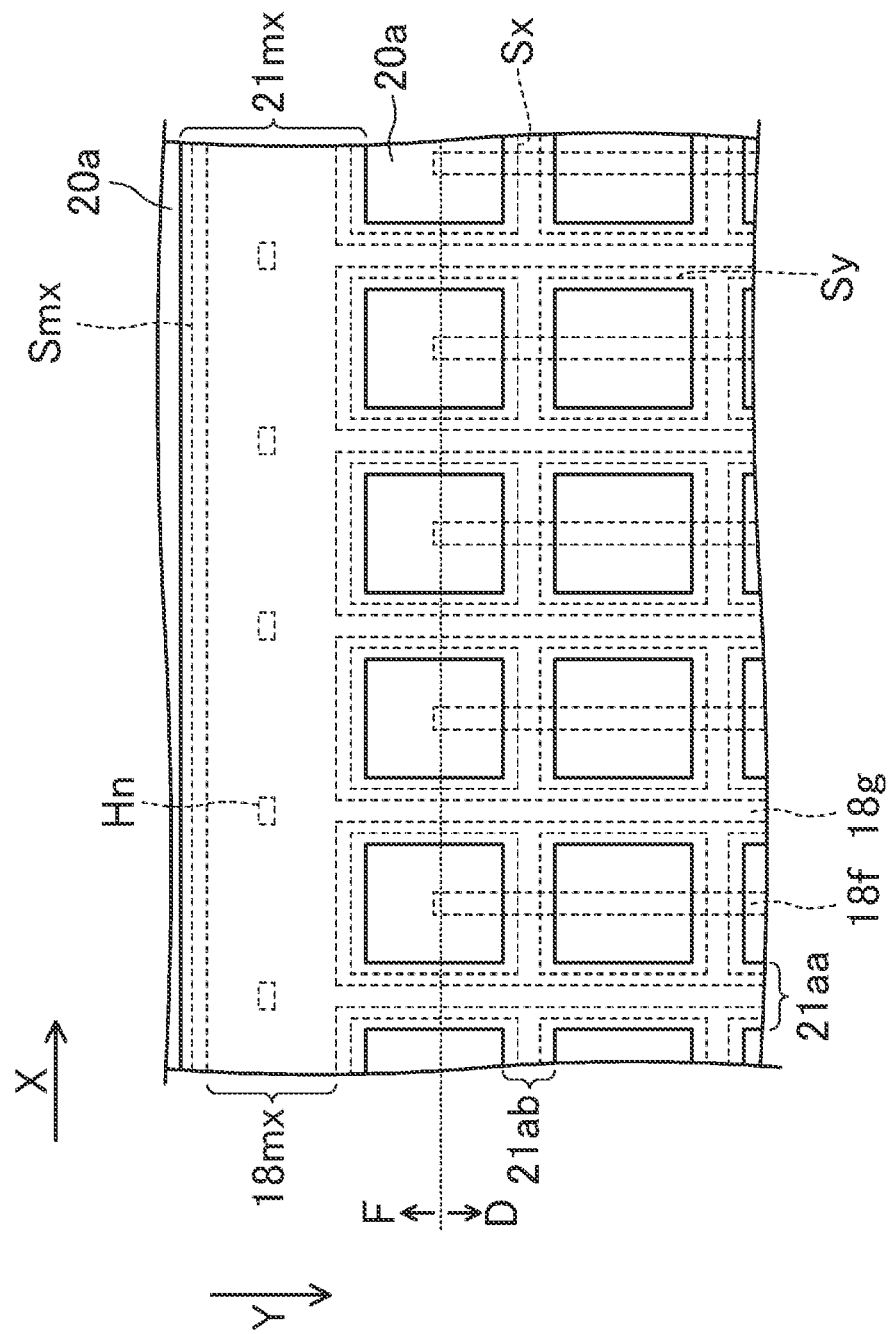
FIG. 14 is an enlarged plan view of a region Rx in FIG. 1.
Figure 15:
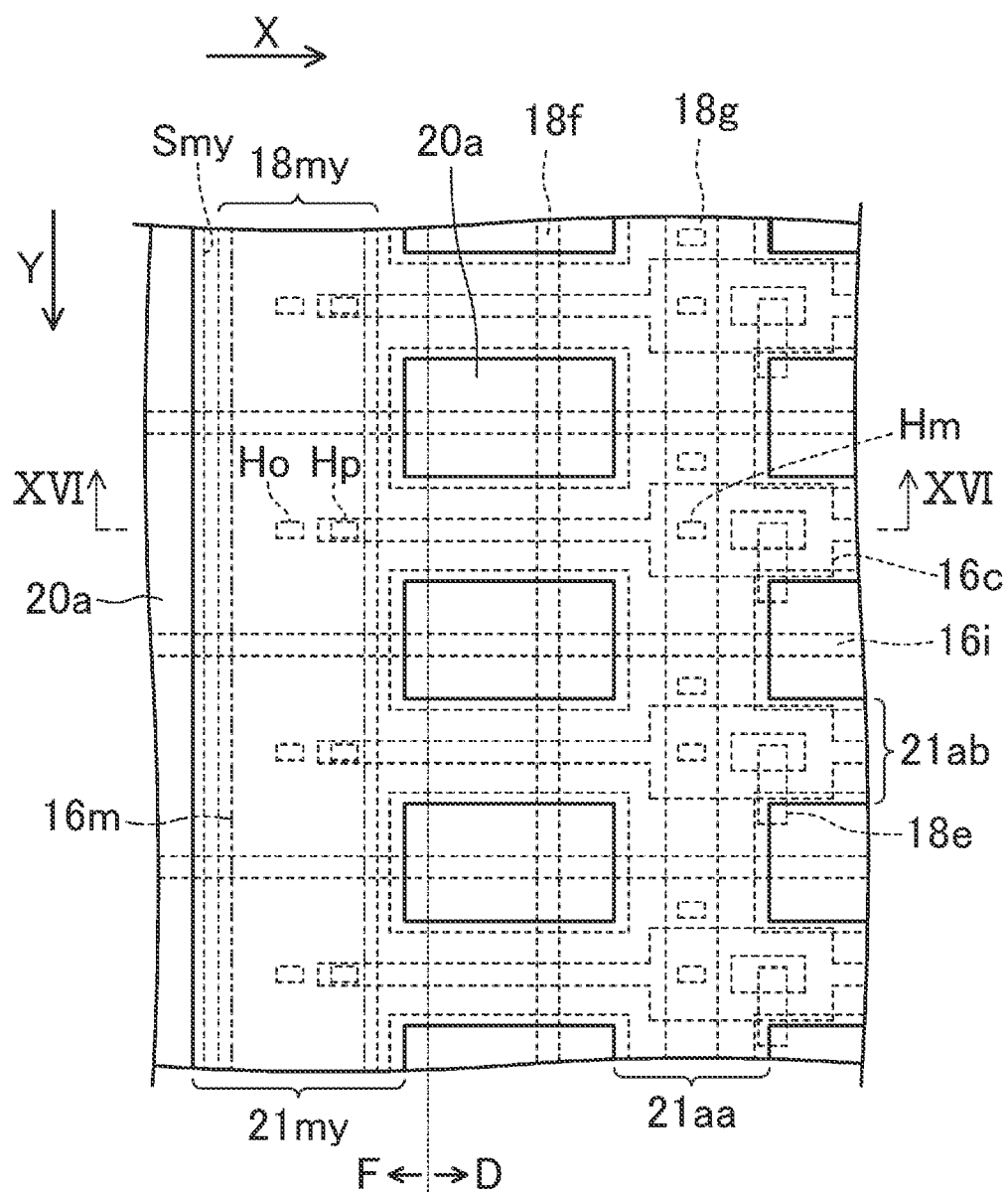
FIG. 15 is an enlarged plan view of a region Ry in FIG. 1.
Figure 16:
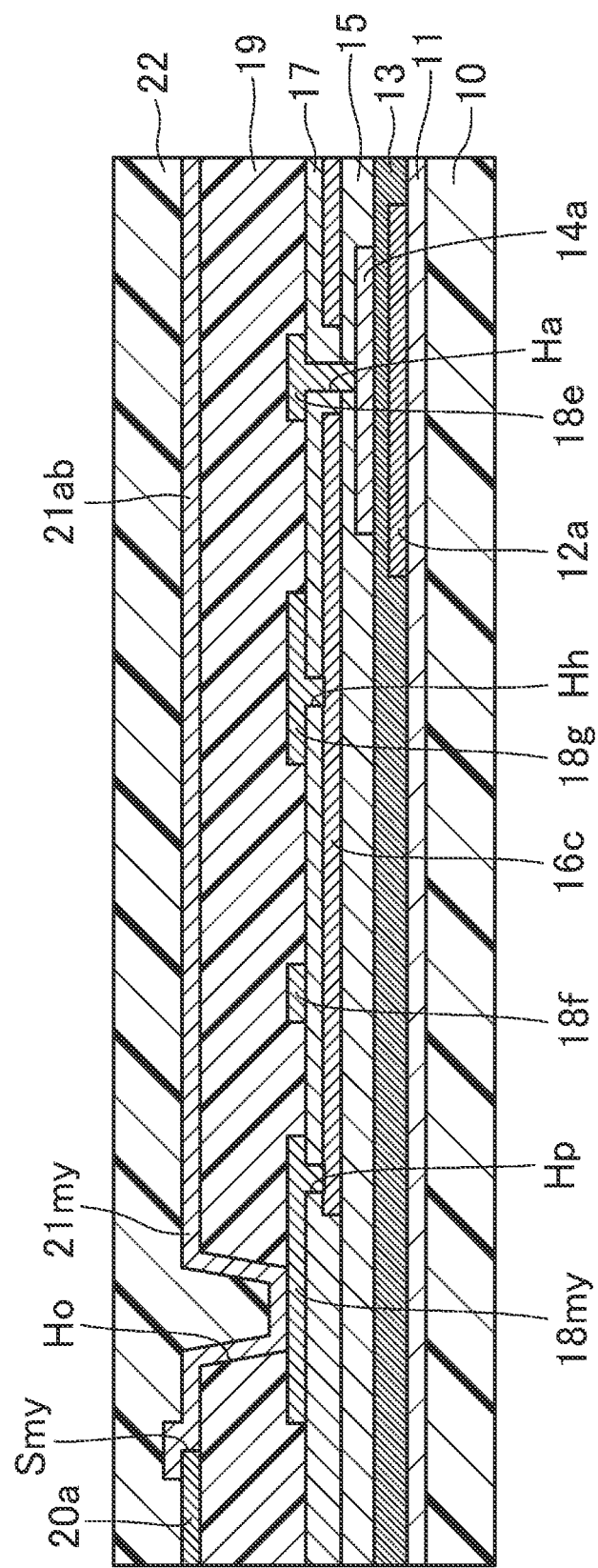
FIG. 16 is a sectional view of a TFT layer 30a taken along line XVI-XVI in FIG. 15.
Figure 17:
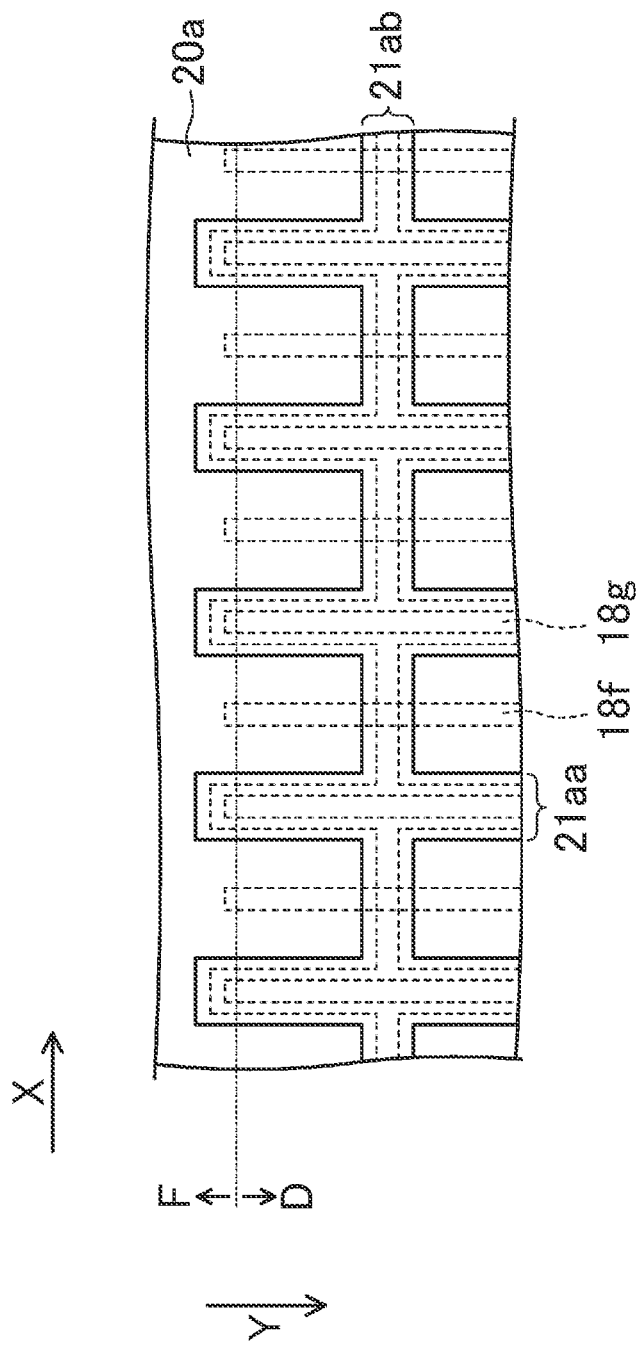
FIG. 17 is a diagram of a modification of the organic EL display according to the first embodiment of the disclosure and corresponds to FIG. 14.

FIG. 1 to FIG. 17 illustrate a first embodiment of a display device according to the disclosure. It is noted that the following embodiments each exemplify an organic EL display including organic EL elements as a display device including light-emitting elements. Here, FIG. 1 is a plan view of the schematic configuration of an organic EL display 50a in this embodiment. Further, FIG. 2 is a plan view of a display region D of the organic EL display 50a. Further, FIG. 3, FIG. 4, FIG. 5, and FIG. 6 are plan views of a first wire layer 14, a fourth wire layer 16, a second wire layer 18, and a third wire layer 21 that are disposed in the display region D of the organic EL display 50a. Further, FIG. 7 is a plan view of a TFT layer 30a that constitutes the organic EL display 50a. Further, FIG. 8 is an equivalent circuit diagram of the TFT layer 30a. Further, FIG. 9 is a sectional view of the organic EL display 50a taken along line IX-IX in FIG. 7. Further, FIG. 10 is an enlarged plan view of a region Rd in FIG. 7 and illustrates, as well, a first electrode 31 of an organic EL element layer 40 that constitutes the organic EL display 50a. Further, FIG. 11 and FIG. 12 are sectional views of the TFT layer 30a taken along line XI-XI and line XII-XII in FIG. 10. FIG. 13 is a sectional view of an organic EL layer 33 that constitutes the organic EL display 50a. Further, FIG. 14 and FIG. 15 are enlarged plan views of a region Rx and a region Ry in FIG. 1. Further, FIG. 16 is a sectional view of the TFT layer 30a taken along line XVI-XVI in FIG. 15. Further, FIG. 17 is a diagram of a modification of the organic EL display 50a and corresponds to FIG. 14.

The organic EL display 50a has, for instance, the display region D that is provided in the form of a rectangle and performs image display, and a frame region F provided in the form of a frame around the display region D, as illustrated in FIG. 1. It is noted that although this embodiment has exemplified the display region D having a rectangular shape, this rectangular shape includes substantially rectangular shapes as well, including, for instance, a shape with an arc-shaped side, a shape with an arc-shaped corner, and a shape with a side having a cut partly.

In the display region D, as illustrated in FIG. 2, a plurality of sub-pixels P are arranged in matrix (in rows and columns). Further, in the display region D, as illustrated in FIG. 2, a sub-pixel P with a red-light emission region Er for red display, a sub-pixel P with a green-light emission region Eg for green display, and a sub-pixel P with a blue-light emission region Eb for blue display, for instance are provided so as to be adjacent to each other. It is noted that in the display region D, three sub-pixels P having a red-light emission region Er, a green-light emission region Eg, and a blue-light emission region Eb adjacent to each other constitute a single pixel.

At the lower end of the frame region F in FIG. 1, a terminal section T is provided so as to extend in one direction (X-direction in the drawing). Further, in the frame region F, as illustrated in FIG. 1, a bending portion B bendable, for instance, into 180° (a U-shape) about a bending axis, which is the X-direction in the drawing, is provided between the display region D and the terminal section T so as to extend in one direction (X-direction in the drawing). Further, in the frame region F, a trench G having a substantial C-shape in a plan view is provided in a first flattening film 19 and a second flattening film 22, both of which will be described later on, so as to pass through a first flattening film 19 and a second flattening film 22, as illustrated in FIG. 1. Here, the trench G is provided in the form of a substantial C-shape so as to be open toward the terminal section T in a plan view, as illustrated in FIG. 1.

The organic EL display 50a includes a resin substrate layer 10 provided as a base substrate, the TFT layer 30a provided on the resin substrate layer 10, the organic EL element layer 40 provided on the TFT layer 30a as a light-emitting element layer, and a sealing film 45 provided on the organic EL element layer 40, as illustrated in FIG. 9.

The resin substrate layer 10 is composed of polyimide resin and other materials for instance.

Figure 3:
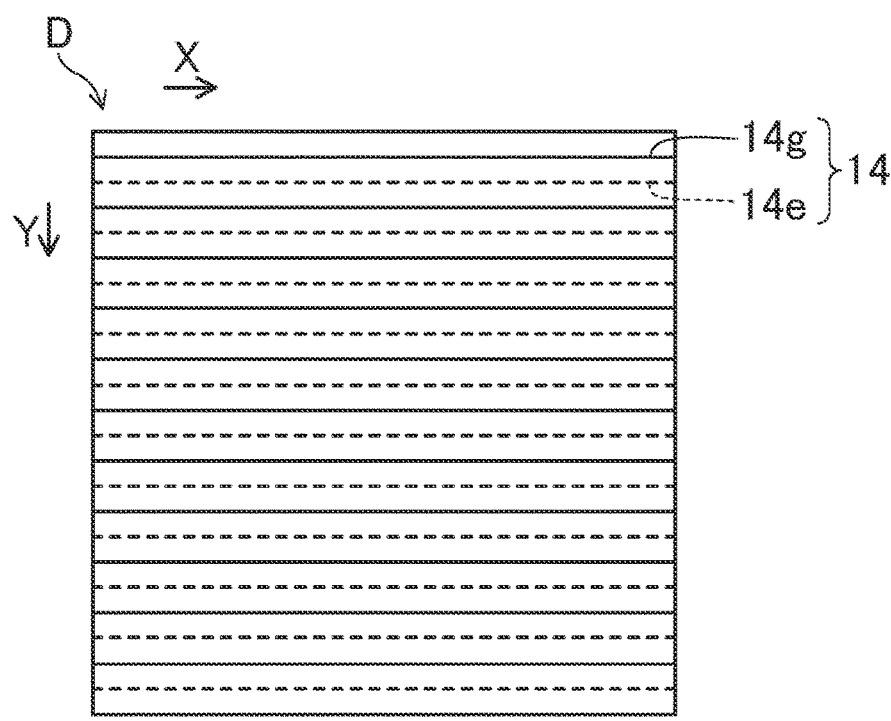
FIG. 3 is a plan view of a first wire layer that is disposed in the display region of the organic EL display according to the first embodiment of the disclosure.
Figure 4:
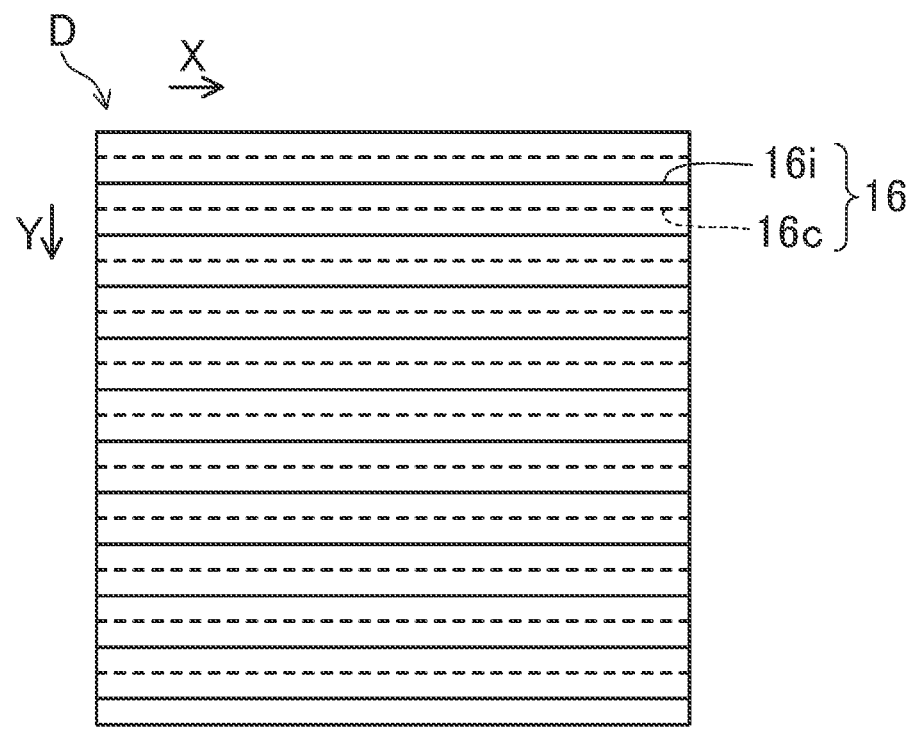
FIG. 4 is a plan view of a fourth wire layer that is disposed in the display region of the organic EL display according to the first embodiment of the disclosure.

The TFT layer 30a includes a base coat film 11, a semiconductor layer 12a, a gate insulating film 13, the first wire layer 14, a lower first interlayer insulating film 15, the fourth wire layer 16, an upper first interlayer insulating film 17, the second wire layer 18, the first flattening film 19, a second interlayer insulating film 20a, the third wire layer 21, and the second flattening film 22 stacked sequentially on the resin substrate layer 10, as illustrated in FIG. 9. The TFT layer 30a also includes a first initialization TFT9a, a threshold voltage compensation TFT9b, a writing control TFT9c, a drive TFT9d, a power supply TFT9e, a light-emission control TFT9f, a second initialization TFT9g, and a capacitor 9h provided on the base coat film 11 for each sub-pixel P, as illustrated in FIG. 7 and FIG. 8. The TFT layer 30a also includes, in the display region D, a plurality of gate lines 14g provided on the gate insulating film 13 as the first wire layer 14 so as to extend in parallel with each other in a row direction (X-direction in the drawing), as illustrated in FIG. 2 and FIG. 3. The TFT layer 30a further includes, in the display region D, a plurality of light-emission control lines 14e provided on the gate insulating film 13 as the first wire layer 14 so as to extend in parallel with each other in the row direction (X-direction in the drawing), as illustrated in FIG. 2 and FIG. 3. It is noted that each light-emission control line 14e is provided so as to be adjacent to each gate line 14g, as illustrated in FIG. 2 and FIG. 3. The TFT layer 30a also includes, in the display region D, a plurality of initialization power-source lines 16i provided on the lower first interlayer insulating film 15 as the fourth wire layer 16 so as to extend in parallel with each other in the row direction (X-direction in the drawing), as illustrated in FIG. 2 and FIG. 4. The TFT layer 30a further includes, in the display region D, a plurality of third power-source lines 16c provided on the lower first interlayer insulating film 15 as the fourth wire layer 16 so as to extend in parallel with each other in the row direction (X-direction in the drawing), as illustrated in FIG. 2 and FIG. 4. It is noted that each third power-source line 16c is provided so as to be adjacent to each initialization power-source line 16i, as illustrated in FIG. 4. The TFT layer 30a also includes, in the display region D, a plurality of source lines 18f provided on the upper first interlayer insulating film 17 as the second wire layer 18 so as to extend in parallel with each other in a column direction (Y-direction in the drawing), as illustrated in FIG. 2 and FIG. 5. The TFT layer 30a further includes, in the display region D, a plurality of second power-source lines 18g provided on the upper first interlayer insulating film 17 as the second wire layer 18 so as to extend in parallel with each other in the column direction (Y-direction in the drawing), as illustrated in FIG. 2 and FIG. 5. It is noted that each second power-source line 18g is provided so as to be adjacent to each source line 18f, as illustrated in FIG. 2 and FIG. 5. Furthermore, the plurality of second power-source lines 18g and the plurality of third power-source lines 16c are, in each sub-pixel P, electrically connected together via eighth contact holes Hh, formed in the upper first interlayer insulating film 17, as illustrated in FIG. 16. The TFT layer 30a also includes a plurality of first power-source lines 21aa provided on the second interlayer insulating film 20a as the third wire layer 21 so as to extend in parallel with each other in the column direction (Y-direction in the drawing), as illustrated in FIG. 6. It is noted that the plurality of first power-source lines 21aa and the plurality of second power-source lines 18g are, in each sub-pixel P, electrically connected together via third through-holes Hk, formed in the first flattening film 19, as illustrated in FIG. 10 and FIG. 12. The TFT layer 30a further includes a plurality of other first power-source lines 21ab provided on the second interlayer insulating film 20a as the third wire layer 21 so as to extend in parallel with each other in the row direction (X-direction in the drawing), as illustrated in FIG. 6. It is noted that the plurality of first power-source lines 21aa and the plurality of other first power-source lines 21ab are provided integrally in the form of a lattice, as illustrated in FIG. 6. Here, the first wire layer 14, the fourth wire layer 16, the second wire layer 18, and the third wire layer 21 are formed of a monolayer film of metal, including molybdenum (Mo), titanium (Ti), aluminum (Al), copper (Cu), and tungsten (W), or these layers are formed of a laminated film of metal, including Mo (upper layer)-Al(middle layer)-Mo (lower layer), Ti-Al-Ti, Al (upper layer)-Ti (lower layer), Cu-Mo, and Cu-Ti. Further, the first wire layer 14 and the fourth wire layer 16 are preferably formed of materials identical to each other. Further, the second wire layer 18 and the third wire layer 21 are preferably formed of materials identical to each other. It is noted that the base coat film 11, the gate insulating film 13, the lower first interlayer insulating film 15, the upper first interlayer insulating film 17, and the second interlayer insulating film 20a are composed of an inorganic insulating monolayer film or inorganic insulating laminated film of silicon nitride, silicon oxide, silicon nitride oxide, or other materials for instance. Further, the semiconductor layer 12a is composed of, but not limited to, a low-temperature polysilicon film or an In—Ga—Zn—O-based oxide semiconductor film for instance. Further, the first flattening film 19, the second flattening film 22, and an edge cover, which will described later on, are composed of an organic resin material, such as polyimide resin. It is noted that although this embodiment has exemplified a configuration where the fourth wire layer 16 is provided between the lower first interlayer insulating film 15 and the upper first interlayer insulating film 17, the fourth wire layer 16 (and the upper first interlayer insulating film 17) may be omitted.

The first initialization TFT9a, the threshold voltage compensation TFT9b, the writing control TFT9c, the drive TFT9d, the power supply TFT9e, the light-emission control TFT9f, and the second initialization TFT9g each include a first terminal (see Na in FIG. 8) and a second terminal (see Nb in FIG. 8) disposed so as to be spaced from each other and include a control terminal for controlling the continuity between the first terminal and the second terminal. It is noted that the first terminal and second terminal of the individual TFTs 9a to 9g are conductor regions of the semiconductor layer 12a.

The first initialization TFT9a is provided in each sub-pixel P such that its control terminal is electrically connected to the corresponding gate line 14g, such that its first terminal is electrically connected to a gate electrode 14a of the capacitor 9h, which will be described later on, and such that its second terminal is electrically connected to the corresponding initialization power-source line 16i, as illustrated in FIG. 8. It is noted that the control terminal of the first initialization TFT9a is two portions of the gate line 14g overlapping the semiconductor layer 12a, as illustrated in FIG. 7. Further, the first terminal of the first initialization TFT9a is electrically connected to the gate electrode 14a of the capacitor 9h via a third contact hole Hc, formed in the gate insulating film 13, lower first interlayer insulating film 15 and upper first interlayer insulating film 17, and via a first contact hole Ha, formed in the third connection wire 18e, lower first interlayer insulating film 15 and upper first interlayer insulating film 17, as illustrated in FIG. 7 and FIG. 9. Further, the second terminal of the first initialization TFT9a is electrically connected to the initialization power-source line 16*i* via a fourth contact hole Hd, formed in the gate insulating film 13, lower first interlayer insulating film 15 and upper first interlayer insulating film 17, and via a fifth contact hole He, formed in the fourth connection wire 18*k* and upper first interlayer insulating film 17, as illustrated in FIG. 7. Here, the first initialization TFT9*a* is configured to initialize voltage that is applied to the control terminal of the drive TFT9*d*, upon application of the voltage of the initialization power-source line 16*i* across the capacitor 9*h*. It is noted that the first initialization TFT9*a* is electrically connected to a gate line 14g(*n*−1), which undergoes scanning immediately before a gate line 14g(*n*) electrically connected to the respective control terminals of the threshold voltage compensation TFT9*b* and writing control TFT9*c*.

The threshold voltage compensation TFT9*b* is provided in each sub-pixel P such that its control terminal is electrically connected to the corresponding gate line 14*g*, such that its first terminal is electrically connected to the second terminal of the drive TFT9*d*, and such that its second terminal is electrically connected to the control terminal of the drive TFT9*d*, as illustrated in FIG. 8. It is noted that the control terminal of the threshold voltage compensation TFT9*b* is two portions of the gate line 14*g* overlapping the semiconductor layer 12*a*, as illustrated in FIG. 7. Further, the first terminal of the threshold voltage compensation TFT9*b* is formed integrally with the second terminal of the drive TFT9*d* to be electrically connected to the second terminal of the drive TFT9*d*, as illustrated in FIG. 7. Further, the second terminal of the threshold voltage compensation TFT9*b* is electrically connected to the gate electrode 14*a* of the drive TFT9*d* via the third contact hole Hc, the third connection wire 18*e*, and the first contact hole Ha, as illustrated in FIG. 7. Here, the threshold voltage compensation TFT9*b* is configured to bring the drive TFT9*d* into diode connection in accordance with the selection of the gate line 14*g* to compensate for the threshold voltage of the drive TFT9*d*.

The writing control TFT9*c* is provided in each sub-pixel P such that its control terminal is electrically connected to the corresponding gate line 14*g*, such that its first terminal is electrically connected to the corresponding source line 18*f*, and such that its second terminal is electrically connected to the first terminal of the drive TFT9*d*, as illustrated in FIG. 8. It is noted that the control terminal of the writing control TFT9*c* is a portion of the gate line 14*g* overlapping the semiconductor layer 12*a*, as illustrated in FIG. 7. Further, the first terminal of the writing control TFT9*c* is electrically connected to the source line 18*f* via a sixth contact hole Hf, formed in the gate insulating film 13, lower first interlayer insulating film 15 and upper first interlayer insulating film 17, as illustrated in FIG. 7. Further, the second terminal of the writing control TFT9*c* is formed integrally with the first terminal of the drive TFT9*d* to be electrically connected to the first terminal of the drive TFT9*d*, as illustrated in FIG. 7. Here, the writing control TFT9*c* is configured to apply the voltage of the source line 18*f* to the first terminal of the drive TFT9*d* in accordance with the selection of the gate line 14*g*.

The drive TFT9*d* is provided in each sub-pixel P such that its control terminal is electrically connected to the first terminal of the first initialization TFT9*a* and the second terminal of the threshold voltage compensation TFT9*b*, such that its first terminal is electrically connected to the respective second terminals of the writing control TFT9*c* and power supply TFT9*e*, and such that its second terminal is electrically connected to the respective first terminals of the threshold voltage compensation TFT9*b* and light-emission control TFT9*f*, as illustrated in FIG. 8. Here, the drive TFT9*d* is configured to apply drive current corresponding to voltage that is applied between its control terminal and its first terminal, to the first terminal of the light-emission control TFT9*f* to regulate the amount of current through an organic EL element 35.

The drive TFT9*d* more specifically includes the semiconductor layer 12*a*, the gate insulating film 13, the gate electrode (control terminal) 14*a*, the lower first interlayer insulating film 15, and the upper first interlayer insulating film 17 provided sequentially on the base coat film 11, as illustrated in FIG. 7 and FIG. 9. Here, the semiconductor layer 12*a* is provided in the form of a bent shape on the base coat film 11, as illustrated in FIG. 7 and FIG. 9. Further, the semiconductor layer 12*a* includes an intrinsic region provided so as to overlap the gate electrode 14*a* in a plan view, and a pair of conductor regions provided so as to sandwich the intrinsic region. It is noted that the intrinsic region is provided in the form of a substantial V-shape in its middle part in a plan view, as illustrated in FIG. 7. Further, one of the conductor regions of the semiconductor layer 12*a* is provided as a first terminal and is, as illustrated in FIG. 7, formed integrally with the respective second terminals of the writing control TFT9*c* and power supply TFT9*e* to be electrically connected to the respective second terminals of the writing control TFT9*c* and power supply TFT9*e*. Further, the other conductor region of the semiconductor layer 12*a* is provided as a second terminal and is, as illustrated in FIG. 7, formed integrally with the respective first terminals of the threshold voltage compensation TFT9*b* and light-emission control TFT9*f* to be electrically connected to the respective first terminals of the threshold voltage compensation TFT9*b* and light-emission control TFT9*f* Further, the gate insulating film 13 is provided so as to cover the semiconductor layer 12*a*, as illustrated in FIG. 9. Further, the gate electrode 14*a* is provided on the gate insulating film 13 as the first wire layer 14 in the form of a rectangular island in a plan view so as to overlap the intrinsic region of the semiconductor layer 12*a*, as illustrated in FIG. 7 and FIG. 9. Further, the lower first interlayer insulating film 15 is provided so as to cover the gate electrode 14*a*, as illustrated in FIG. 9. Further, the upper first interlayer insulating film 17 is provided on the lower first interlayer insulating film 15 with the third power-source line 16*c* interposed therebetween, as illustrated in FIG. 9.

The power supply TFT9*e* is provided in each sub-pixel P such that its control terminal is electrically connected to the corresponding light-emission control line 14*e*, such that its first terminal is electrically connected to the corresponding second power-source line 18*g*, and such that its second terminal is electrically connected to the first terminal of the drive TFT9*d*, as illustrated in FIG. 8. It is noted that the control terminal of the power supply TFT9*e* is a portion of the light-emission control line 14*e* overlapping the semiconductor layer 12*a*, as illustrated in FIG. 7. Further, the first terminal of the power supply TFT9*e* is electrically connected to the second power-source line 18*g* via a second contact hole Hb, formed in the gate insulating film 13, lower first interlayer insulating film 15 and upper first interlayer insulating film 17, as illustrated in FIG. 7. Further, the second terminal of the power supply TFT9*e* is formed integrally with the first terminal of the drive TFT9*d* to be electrically connected to the first terminal of the drive TFT9*d*, as illustrated in FIG. 7. Here, the power supply TFT9*e* is configured to apply the voltage of the second power-source line 18*g* to the first terminal of the drive TFT9*d* in accordance with the selection of the light-emission control line 14*e*.

The light-emission control TFT9f is provided in each sub-pixel P such that its control terminal is electrically connected to the corresponding light-emission control line 14e, such that its first terminal is electrically connected to the second terminal of the drive TFT9d, and such that its second terminal is electrically connected to the first electrode 31 of the organic EL element 35, which will be described later on, as illustrated in FIG. 8. It is noted that the control terminal of the light-emission control TFT9f is a portion of the light-emission control line 14e overlapping the semiconductor layer 12a, as illustrated in FIG. 7. Further, the first terminal of the light-emission control TFT9f is formed integrally with the second terminal of the drive TFT9d to be electrically connected to the second terminal of the drive TFT9d, as illustrated in FIG. 7. Further, the second terminal of the light-emission control TFT9f is electrically connected to the first electrode 31 of the organic EL element 35 via a seventh contact hole Hg, formed in the gate insulating film 13, lower first interlayer insulating film 15 and upper first interlayer insulating film 17, and via a second connection wire 18j, provided as the second wire layer 18, as illustrated in FIG. 7. Here, the light-emission control TFT9f is configured to apply the foregoing drive current to the organic EL element 35 in accordance with the selection of the light-emission control line 14e.

The second initialization TFT9g is provided in each sub-pixel P such that its control terminal is electrically connected to the corresponding gate line 14g, such that its first terminal is electrically connected to the first electrode 31 of the organic EL element 35, and such that its second terminal is electrically connected to the corresponding initialization power-source line 16i, as illustrated in FIG. 8. It is noted that the control terminal of the second initialization TFT9g is a portion of the gate line 14g overlapping the semiconductor layer 12a, as illustrated in FIG. 7. Further, the first terminal of the second initialization TFT9g is formed integrally with the second terminal of the light-emission control TFT9f to be electrically connected to the first electrode 31 of the organic EL element 35, as illustrated in FIG. 7. Further, the second terminal of the second initialization TFT9g is electrically connected to the initialization power-source line 16i via the fourth contact hole Hd, the fourth connection wire 18k, and the fifth contact hole He, as illustrated in FIG. 7. Here, the second initialization TFT9g is configured to reset electric charge accumulated in the first electrode 31 of the organic EL element 35 in accordance with the selection of the gate line 14g.

It is noted that although this embodiment has exemplified the TFTs 9a to 9g of a top-gate type, the TFTs 9a to 9g may be bottom-gate TFTs.

The capacitor 9h includes the gate electrode 14a, the lower first interlayer insulating film 15 provided on the gate electrode 14a, and the third power-source line 16c provided on the lower first interlayer insulating film 15 so as to overlap the gate electrode 14a in a plan view, as illustrated in FIG. 7 and FIG. 9. Further, the capacitor 9h is provided in each sub-pixel P such that its gate electrode 14a is formed integrally with the gate electrode 14a of the drive TFT9d to be electrically connected to the first terminal of the first initialization TFT9a and the second terminal of the threshold voltage compensation TFT9b, and such that the third power-source line 16c is electrically connected to the corresponding second power-source line 18g via an eighth contact hole Hh, formed in the upper first interlayer insulating film 17, as illustrated in FIG. 7 and FIG. 8. Here, the capacitor 9h is configured to accumulate electricity at the voltage of the corresponding source line 18f when the corresponding gate line 14g remains selected, and to hold the accumulated voltage, thus maintaining voltage that is applied to the gate electrode 14a of the drive TFT9d when the corresponding gate line 14g remains unselected. Further, the third power-source line 16c is provided all around the perimeter of the gate electrode 14a and reaches the outside of the perimeter of the gate electrode 14a, as illustrated in FIG. 7. Further, the third power-source line 16c has a through-hole A provided so as to overlap the gate electrode 14a in a plan view and to pass through the third power-source line 16c, as illustrated in FIG. 7 and FIG. 9. Further, the upper first interlayer insulating film 17 is provided on the third power-source line 16c so as to cover the third power-source line 16c, as illustrated in FIG. 9. Further, the gate electrode 14a is electrically connected to the third connection wire 18e, provided as the second wire layer 18, via the first contact hole Ha, as illustrated in FIG. 7 and FIG. 9.

The organic EL element layer 40 is composed of a plurality of organic EL elements 35 arranged in in matrix and includes, as illustrated in FIG. 9, a plurality of first electrodes 31, a plurality of organic EL layers 33, and a second electrode 34 provided so as to be stacked sequentially on the TFT layer 30a.

The plurality of first electrodes 31 are provided in matrix on the second flattening film 22 so as to correspond to the plurality of sub-pixels P, as illustrated in FIG. 9 and FIG. 10. Here, the first electrode 31 is, in each sub-pixel P, electrically connected to the second connection wire 18j via a first through-hole Hi, formed in the second flattening film 22, via a first connection wire 21b, provided as the third wire layer 21, and via a second through-hole Hj, formed in the first flattening film 19, as illustrated in FIG. 11. It is noted that the second interlayer insulating film 20a has a contact opening M provided so as to pass through the second interlayer insulating film 20a to overlap the first connection wire 21b, and such that its edge surrounds the first through-hole Hi and the second through-hole Hj in a plan view, as illustrated in FIG. 10 and FIG. 11. The second interlayer insulating film 20a also has a column slit Sy provided so as to pass through the second interlayer insulating film 20a to overlap each first power-source line 21aa from one end of the display region D to the other end, as illustrated in FIG. 10 and FIG. 12. The second interlayer insulating film 20a also has a row slit Sx provided so as to pass through the second interlayer insulating film 20a to overlap each of the other first power-source lines 21ab from one end of the display region D to the other end, as illustrated in FIG. 10 and FIG. 11. Furthermore, the first electrode 31 has the function of injecting holes (positive holes) into the organic EL layer 33. The first electrode 31 is also more desirably formed using a material with a large work function in order to improve the efficiency of hole injection into the organic EL layer 33. Here, an example material constituting the first electrode 31 is a metal material, including silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Further, an example material constituting the first electrode 31 may be an alloy, including an alloy of astatine (At) and astatine oxide ($AtO_2$). Furthermore, an example material constituting the first electrode 31 may be, but not limited to, a conductive oxide such as tin oxide (SnO), zinc oxide (ZnO), an indium tin oxide (ITO), and an indium zinc oxide (IZO). Further, the first electrode 31 may be formed by stacking a plurality of layers made of the foregoing materials. It is noted that examples of a compound material with a large work function include an indium tin oxide (ITO) and an indium zinc oxide (IZO). Further, the edge of the first electrode 31 is covered with the edge cover provided in the form of a lattice so as to be common to the plurality of sub-pixels P.

The plurality of organic EL layers 33 are disposed on the individual first electrodes 31, as illustrated in FIG. 9, and are provided in matrix as light-emitting layers so as to correspond to the plurality of sub-pixels P. Here, each organic EL layer 33 includes a hole injection layer 1, a hole transport layer 2, an organic light-emitting layer 3, an electron transport layer 4, and an electron injection layer 5 provided sequentially on the first electrode 31, as illustrated in FIG. 13.

The hole injection layer 1 is also called an anode buffer layer and has the function of bringing the energy levels of the first electrode 31 and organic EL layer 33 close to improve the efficiency of hole injection from the first electrode 31 into the organic EL layer 33. Here, examples of a material constituting the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 has the function of improving the efficiency of hole transport from the first electrode 31 to the organic EL layer 33. Here, examples of a material constituting the hole transport layer 2 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The organic light-emitting layer 3 is a region where holes and electrons are injected respectively from the first electrode 31 and the second electrode 34 upon voltage application to the first electrode 31 and the second electrode 34, and where the holes and electrons rejoin. Here, the organic light-emitting layer 3 is formed of a material with high light-emission efficiency. Moreover, examples of a material constituting the organic light-emitting layer 3 include a metal oxinoid compound [8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bisstyrylbenzene derivative, a trisstyrilbenzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, and polysilane.

The electron transport layer 4 has the function of moving electrons to the organic light-emitting layer 3 efficiently. Here, an example material constituting the electron transport layer 4 is an organic compound, including an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 has the function of bringing the energy levels of the second electrode 34 and organic EL layer 33 close to improve the efficiency of electron injection from the second electrode 34 into the organic EL layer 33, and this function can lower the drive voltage of the organic EL element 35. It is noted that the electron injection layer 5 is also called a cathode buffer layer. Here, examples of a material constituting the electron injection layer 5 include an inorganic alkali compound such as lithium fluoride (LiF), magnesium fluoride ($MgF_2$), calcium fluoride ($CaF_2$), strontium fluoride ($SrF_2$), orbarium fluoride ($BaF_2$) and include aluminum oxide ($Al_2O_3$) and strontium oxide (SrO).

The second electrode 34 is provided so as to be common to the plurality of sub-pixels P and to cover the individual organic EL layers 33 and the edge cover, as illustrated in FIG. 9. The second electrode 34 also has the function of injecting electrons into the individual organic EL layers 33. The second electrode 34 is also more desirably composed using a material with a small work function in order to improve the efficiency of electron injection into the organic EL layers 33. Here, examples of a material constituting the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Further, the second electrode 34 may be formed of, for instance, an alloy of magnesium (Mg) and copper (Cu), an alloy of magnesium (Mg) and silver (Ag), an alloy of sodium (Na) and potassium (K), an alloy of astatine (At) and astatine oxide ($AtO_2$), an alloy of lithium (Li) and aluminum (Al), an alloy of lithium (Li), calcium (Ca) and aluminum (Al), or an alloy of lithium fluoride (LiF), calcium (Ca) and aluminum (Al). Alternatively, the second electrode 34 may be formed of a conductive oxide, such as tin oxide (SnO), zinc oxide (ZnO), an indium tin oxide (ITO), or an indium zinc oxide (IZO). Further, the second electrode 34 may be formed by stacking a plurality of layers made of the foregoing materials. It is noted that examples of a material with a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

The sealing film 45 is provided so as to cover the second electrode 34 and includes a first inorganic sealing film 41, an organic sealing film 42, and a second inorganic sealing film 43 stacked sequentially on the second electrode 34, as illustrated in FIG. 9, and the sealing film 45 has the function of protecting the organic EL layers 33 of the individual organic EL elements 35 from moisture and oxygen. Here, the first inorganic sealing film 41 and the second inorganic sealing film 43 are composed of an inorganic insulating film, such as a silicon nitride film, a silicon oxide film, or a silicon oxide nitride film. Further, the organic sealing film 42 is composed of an organic resin material, such as acrylic resin, epoxy resin, silicone resin, polyurea resin, parylene resin, polyimide resin, or polyamide resin.

Further, the organic EL display 50a includes, in the frame region F, a first barrier wall Wa provided in the form of a frame outside the trench G, and a second barrier wall Wb provided in the form of a frame around the first barrier wall Wa, as illustrated in FIG. 1.

The first barrier wall Wa and the second barrier wall Wb are composed by stacking a plurality of resin layers so as to stack a resin layer made of the same material and formed in the same layer as the first flattening film 19, and a resin layer made of the same material and formed in the same layer as the second flattening film 22, for instance. It is noted that the first barrier wall Wa is provided so as to overlap the edge of the organic sealing film 42 of the sealing film 45 and is configured so as to prevent the spread of ink constituting the organic sealing film 42.

Further, the organic EL display 50a includes, in the frame region F, a first frame wire 18m provided in the form of a frame as the second wire layer 18 inside the trench G and having both ends in an open portion of the trench G extending to the terminal section T, as illustrated in FIG. 1. Here, the first frame wire 18m is configured such that high power-source voltage (ELVDD) is input at the terminal section T. Further, the first frame wire 18m includes a second trunk wire 18mx provided so as to overlap a first trunk wire 21mx, which will be described later on, and another second trunk wire 18my provided so as to overlap another first trunk wire 21my, which will be described later on, as illustrated in FIG. 1. It is noted that the second trunk wire 18mx branches into a plurality toward the display region D to constitute the plurality of second power-source lines 18g, as illustrated in FIG. 14. Further, the first trunk wire 21mx is provided in the frame region F as the third wire layer 21 so as to extend in the row direction (X-direction in the drawing). It is noted that the first trunk wire 21mx branches into a plurality toward the display region D to constitute the plurality of first power-source lines 21aa, as illustrated in FIG. 14. Further, the second interlayer insulating film 20a has a trunk slit Smx provided so as to overlap the first trunk wire 21mx, as illustrated in FIG. 14. Furthermore, the first trunk wire 21mx and the second trunk wire 18mx are electrically connected to each other via a fourth through-hole Hn, formed in the first flattening film 19, as illustrated in FIG. 14. Further, the other first trunk wire 21my is provided in the frame region F as the third wire layer 21 so as to extend in the column direction (Y-direction in the drawing), as illustrated in FIG. 15. It is noted that the other first trunk wire 21my branches into a plurality toward the display region D to constitute the plurality of other first power-source lines 21ab, as illustrated in FIG. 15. Further, the second interlayer insulating film 20a has a trunk slit Smy provided so as to overlap the other first trunk wire 21my, as illustrated in FIG. 15 and FIG. 16. Further, the other first trunk wire 21my and the other second trunk wire 18my are electrically connected to each other via a fifth through-hole Ho, formed in the first flattening film 19, as illustrated in FIG. 15 and FIG. 16. Further, the other second trunk wire 18my is electrically connected to the third power-source line 16c via a tenth contact hole Hp, formed in the upper first interlayer insulating film 17, as illustrated in FIG. 15 and FIG. 16. It is noted that although this embodiment has exemplified a configuration without a trunk wire formed of the fourth wire layer 16, a third trunk wire 16m (see a chain double-dashed line in FIG. 15) may be provided in the frame region F as the fourth wire layer 16 so as to overlap the other first trunk wire 21my without the initialization power-source lines 16i disposed in the frame region F, and the third trunk wire 16m may branch into a plurality toward the display region D to constitute the plurality of third power-source lines 16c. Further, although this embodiment has exemplified a wiring configuration where the first trunk wire 21mx, the second trunk wire 18mx, the other first trunk wire 21my, and the other second trunk wire 18my are provided, the first trunk wire 21mx and the second trunk wire 18mx (the other first trunk wire 21my and the other second trunk wire 18my) may be omitted, as illustrated in FIG. 17.

Further, the organic EL display 50a includes, in the frame region F, a second frame wire 18i provided in the form of a substantial C-shape as the second wire layer 18 outside the trench G and having both ends extending to the terminal section T, as illustrated in FIG. 1. Here, the second frame wire 18i is electrically connected to the second electrode 34 via a conductive layer, provided in the trench G as the third wire layer 21 and is configured such that low power-source voltage (ELVSS) is input at the terminal section T, for instance.

In the organic EL display 50a with the foregoing configuration, first, the organic EL element 35 is brought into a non-light-emission state in each sub-pixel P when the corresponding light-emission control line 14e is selected to be brought into an inert state. In the non-light-emission state, the corresponding gate line 14g (electrically connected to the first initialization TFT9a and the second initialization TFT9g) is selected, and a gate signal is input to the first initialization TFT9a via the gate line 14g, thus bringing the first initialization TFT9a and the second initialization TFT9g into an ON state, thus applying the voltage of the corresponding initialization power-source line 16i across the capacitor 9h and bringing the drive TFT9d into an ON state. Accordingly, electric charge in the capacitor 9h is discharged, and voltage that is applied to the control terminal (first gate electrode) 14a of the drive TFT9d is initialized. Next, the corresponding gate line 14g (electrically connected to the threshold voltage compensation TFT9b and the writing control TFT9c) is selected to be brought into an active state, thus bringing the threshold voltage compensation TFT9b and the writing control TFT9c into an ON state, thus writing a predetermined voltage corresponding to a source signal that is transmitted through the corresponding source line 18f into the capacitor 9h via the drive TFT9d being in a diode-connection state, and applying an initialization signal through the corresponding initialization power-source line 16i to the first electrode 31 of the organic EL element 35 to reset electric charge accumulated in the first electrode 31. Then, the corresponding light-emission control line 14e is selected to bring the power supply TFT9e and the light-emission control TFT9f into an ON state, thus supplying drive current based on voltage that is applied to the control terminal (gate electrode) 16a of the drive TFT9d, from the corresponding power-source line 18g to the organic EL element 35. In this way, in the organic EL display 50a, the organic EL element 35 emits light in each sub-pixel P at brightness based on drive current, thus performing image display.

The following describes a method for manufacturing the organic EL display 50a in this embodiment. It is noted that the method for manufacturing the organic EL display 50a in this embodiment includes a step of forming a TFT layer, a step of forming an organic EL element layer, and a step of forming a sealing film.

Step of Forming TFT Layer

Firstly, the base coat film 11 is formed by forming an inorganic insulating film (about 1000 nm thick), such as a silicon oxide film, onto the resin substrate layer 10 formed on a glass substrate for instance, through plasma chemical vapor deposition (CVD) for instance.

Subsequently, the entire substrate with the base coat film 11 formed undergoes plasma CVD to form, for instance, an amorphous silicon film (about 50 nm thick), the amorphous silicon film undergoes crystallization through laser annealing or other methods to form a semiconductor film of a polysilicon film, and then the semiconductor film undergoes patterning to form the semiconductor layer 12a.

Then, the entire substrate with the semiconductor layer 12a formed undergoes plasma CVD for instance to form an inorganic insulating film (about 100 nm), such as a silicon oxide film, to form the gate insulating film 13 so as to cover the semiconductor layer 12a.

Furthermore, the entire substrate with the gate insulating film 13 formed undergoes sputtering for instance to sequentially form an aluminum film (about 350 nm thick), a molybdenum nitride film (about 50 nm thick), and other things, and then, these stacked metal films undergo patterning to form the first wire layer 14, including the gate lines 14g.

Subsequently, impurity ions are doped using the first wire layer 14 as a mask to form an intrinsic region and a conductor region in the semiconductor layer 12a.

Then, the entire substrate with the semiconductor layer 12a having the intrinsic region and conductor region formed undergoes plasma CVD for instance to form an inorganic insulating film (about 100 nm thick), such as a silicon oxide film, to form the lower first interlayer insulating film 15.

Subsequently, the entire substrate with the lower first interlayer insulating film 15 formed undergoes sputtering for instance to sequentially form an aluminum film (about 350 nm thick), a molybdenum nitride film (about 50 nm thick), and other things, and then, these stacked metal films undergo patterning to form the fourth wire layer 16, including the third power-source lines 16c.

Furthermore, the entire substrate with the fourth wire layer 16 formed undergoes plasma CVD for instance to form an inorganic insulating film (about 500 nm thick), such as a silicon oxide film, to form the upper first interlayer insulating film 17.

Then, the upper first interlayer insulating film 17, the lower first interlayer insulating film 15, and the gate insulating film 13 undergo patterning to form the contact holes Ha and other things.

Subsequently, the entire substrate with the contact holes Ha and other things formed undergoes sputtering for instance to sequentially form a titanium film (about 30 nm thick), an aluminum film (about 300 nm thick), a titanium film (about 50 nm thick), and other things, and then, these stacked metal films undergo patterning to form the second wire layer 18, including the source lines 18f.

Furthermore, the entire substrate with the second wire layer 18 formed undergoes application of a polyimide photosensitive resin layer (about 2 m thick) through spin coating or slit coating for instance, and then, this applied film undergoes pre-baking, exposure, development, and post-baking to form the first flattening film 19 having the through-holes Hj and other things.

Then, the entire substrate with the first flattening film 19 formed undergoes plasma CVD for instance to form an inorganic insulating film (about 500 nm thick), such as a silicon oxide film, and then, the inorganic insulating film undergoes patterning to form the second interlayer insulating film 20a.

Subsequently, the entire substrate with the second interlayer insulating film 20a formed undergoes sputtering for instance to sequentially form a titanium film (about 30 nm thick), an aluminum film (about 300 nm thick), a titanium film (about 50 nm thick), and other things, and then, these stacked metal films undergo patterning to form the third wire layer 21, including the first power-source lines 21aa.

Finally, the entire substrate with the third wire layer 21 formed undergoes application of a polyimide photosensitive resin layer (about 2 m thick) through spin coating or slit coating, for instance, and then, this applied film undergoes pre-baking, exposure, development, and post-baking to form the second flattening film 22 having the through-holes Hi and other things.

The TFT layer 30a can be formed in this way.

Step of Forming Organic EL Element Layer

The organic EL element layer 40 is formed by forming, through a known method, the first electrodes 31, the edge cover 32, the organic EL layers 33 (the hole injection layers 1, the hole transport layers 2, the organic light-emitting layers 3, the electron transport layers 4, and the electron injection layers 5), and the second electrode 34 onto the second flattening film 22 of the TFT layer 30a formed in the step of forming a TFT layer.

Step of Forming Sealing Film

The sealing film 45 (the first inorganic sealing insulating film 41, the organic sealing film 42, and the second inorganic sealing insulating film 43) is formed, through a known method, onto the organic EL element layer 40 formed in the step of forming an organic EL element layer. Then, the substrate surface with the sealing film 45 formed undergoes attachment of a protective sheet (not shown), followed by laser light irradiation from the glass substrate of the resin substrate layer 10 to remove the glass substrate from the lower surface of the resin substrate layer 10, and furthermore, a protective sheet (not shown) is attached onto the lower surface of the resin substrate layer 10 with the glass substrate removed.

The organic EL display 50a in this embodiment can be manufactured in this way.

In the organic EL display 50a in this embodiment, the contact opening M is provided in the second interlayer insulating film 20a so as to pass through the second interlayer insulating film 20a to overlap the first connection wire 21b, and such that its edge surrounds the first through-hole Hi and the second through-hole Hj in a plan view, as described above. As a result of this, continuity between the first through-hole Hi and the second through-hole Hj can be established, because the first connection wire 21b does not break between the first through-hole Hi and the second through-hole Hj even if the first connection wire 21b breaks at the edge of the contact opening M due to a level difference. Further, the contact opening M, which is larger than the first through-hole Hi and the second through-hole Hj in a plan view, can bring the first connection wire 21b into contact with the second connection wire 18j with certainty. Hence, faulty electrical continuity between the second connection wire 18j and the first connection wire 21b can be prevented in a stacked structure where the second connection wire 18j (non-connection wire), the first flattening film 19, the second interlayer insulating film 20a, and the first connection wire 21b (connection wire) are provided sequentially.

Further, in the organic EL display 50a in this embodiment, the edge of the contact opening M, provided in the second interlayer insulating film 20a, surrounds the first through-hole Hi and the second through-hole Hj, thereby enabling moisture and other substances contained in the first flattening film 19 to be easily drained outside during the manufacturing process steps, thus improving the reliability of the organic EL element 35.

Other Embodiments

Although the foregoing embodiment has exemplified an organic EL layer of a five-ply stacked structure of a hole injection layer, a hole transport layer, a light-emitting layer, an electron transport layer, and an electron injection layer, the organic EL layer may be, for instance, a three-ply stacked structure of a hole injection and transport layer, a light-emitting layer, and an electron transport and injection layer.

Further, although the foregoing embodiment has exemplified an organic EL display having a first electrode as an anode and a second electrode as a cathode, the disclosure is applicable to an organic EL display having an organic EL layer of inverted stacked structure: a first electrode as a cathode and a second electrode as an anode.

Further, although the foregoing embodiment has described an organic EL display as a display device for instance, the disclosure is applicable to a display device including a plurality of light-emitting elements that are driven by current. For instance, the disclosure is applicable to a display device including quantum-dot light-emitting diodes (QLEDs), which are light-emitting elements using a quantum-dot-containing layer.

INDUSTRIAL APPLICABILITY

As described above, the disclosure is useful for a flexible display device.

The invention claimed is:

1. A display device comprising:
a base substrate;
a thin-film transistor layer having a semiconductor layer, a first wire layer, and a gate insulating film disposed between the semiconductor layer and the first wire layer, the thin-film transistor layer being provided on the base substrate and including the first wire layer, a first interlayer insulating film, a second wire layer, a first flattening film, a second interlayer insulating film, a third wire layer, and a second flattening film stacked sequentially;
a light-emitting element layer provided on the thin-film transistor layer and including a plurality of first electrodes, a plurality of light-emitting layers, and a common second electrode stacked sequentially in correspondence with a plurality of sub-pixels disposed in rows and columns to constitute a display region;
a plurality of gate lines provided in the display region as the first wire layer so as to extend in parallel with each other in a row direction;
a plurality of source lines provided in the display region as the second wire layer so as to extend in parallel with each other in a column direction; and
a plurality of first power-source lines provided in the display region as the third wire layer so as to extend in parallel with each other in a column direction,
wherein the second interlayer insulating film has a column slit provided so as to pass through the second interlayer insulating film to overlap the plurality of first power-source lines from one end to another end of the display region.

2. The display device according to claim 1, comprising
a plurality of other first power-source lines provided in the display region as the third wire layer so as to extend in parallel with each other in a row direction,
wherein the plurality of first power-source lines and the plurality of other first power-source lines are provided integrally in a lattice form, and
the second interlayer insulating film has a row slit provided so as to pass through the second interlayer insulating film to overlap the plurality of other first power-source lines from one end to another end of the display region.

3. The display device according to claim 2, comprising
another first trunk wire provided in a frame region as the third wire layer so as to extend in a column direction, the frame region being around the display region,
wherein the another first trunk wire branches into a plurality toward the display region to constitute the plurality of other first power-source lines, and
the second interlayer insulating film has a slit provided so as to overlap the another first trunk wire and the plurality of other first power-source lines.

4. The display device according to claim 3, comprising
another second trunk wire provided in the frame region as the second wire layer so as to overlap the another first trunk wire.

5. The display device according to claim 4, wherein
the first interlayer insulating film includes a lower first interlayer insulating film, and an upper first interlayer insulating film provided on the lower first interlayer insulating film with a fourth wire layer interposed,
the display device comprises
a plurality of third power-source lines provided in the display region as the fourth wire layer so as to extend in parallel with each other in a row direction, and
a third trunk wire provided in the frame region as the fourth wire layer so as to overlap the another first trunk wire, wherein
the third trunk wire branches into a plurality toward the display region to constitute the plurality of third power-source lines.

6. The display device according to claim 1, comprising
a plurality of second power-source lines provided in the display region as the second wire layer so as to extend in parallel with each other in a column direction,
wherein the plurality of first power-source lines and the plurality of second power-source lines are electrically connected together via third through-holes formed in the first flattening film.

7. The display device according to claim 6, wherein
the first interlayer insulating film includes a lower first interlayer insulating film, and an upper first interlayer insulating film provided on the lower first interlayer insulating film with a fourth wire layer interposed,
the display device comprises a plurality of third power-source lines provided in the display region as the fourth wire layer so as to extend in parallel with each other in a row direction, and
the plurality of second power-source lines and the plurality of third power-source lines are electrically connected together via contact holes formed in the upper first interlayer insulating film.

8. The display device according to claim 6, comprising
a first trunk wire provided in a frame region as the third wire layer so as to extend in a row direction, the frame region being around the display region,
wherein the first trunk wire branches into a plurality toward the display region to constitute the plurality of first power-source lines, and
the second interlayer insulating film has a trunk slit provided so as to overlap the first trunk wire.

9. The display device according to claim 8, comprising
a second trunk wire provided in the frame region as the second wire layer so as to overlap the first trunk wire, wherein the second trunk wire branches into a plurality toward the display region to constitute the plurality of second power-source lines.

10. The display device according to claim 1, wherein each of the plurality of light-emitting layers is an organic electroluminescence layer.

* * * * *